(12) United States Patent
Kim et al.

(10) Patent No.: US 8,378,342 B2
(45) Date of Patent: Feb. 19, 2013

(54) OXIDE SEMICONDUCTOR AND THIN FILM TRANSISTOR INCLUDING THE SAME

(75) Inventors: Tae-sang Kim, Seoul (KR); Sang-yoon Lee, Seoul (KR); Jang-yeon Kwon, Seongnam-si (KR); Kyoung-seok Son, Seoul (KR); Ji-sim Jung, Incheon (KR); Kwang-hee Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 307 days.

(21) Appl. No.: 12/659,837

(22) Filed: Mar. 23, 2010

(65) Prior Publication Data

US 2010/0276683 A1    Nov. 4, 2010

(30) Foreign Application Priority Data

Mar. 23, 2009 (KR) ........................ 10-2009-0024575
Feb. 18, 2010 (KR) ........................ 10-2010-0014739

(51) Int. Cl.
*H01L 29/786* (2006.01)

(52) U.S. Cl. .................... 257/43; 257/57; 257/E29.043; 257/E29.094; 257/E29.296

(58) Field of Classification Search ................ 257/43, 257/57, E29.296, E29.094, E29.043
See application file for complete search history.

(56) References Cited

U.S. PATENT DOCUMENTS

| 7,816,680 B2* | 10/2010 | Kim et al. | 257/43 |
| 7,935,964 B2* | 5/2011 | Kim et al. | 257/43 |
| 2006/0108636 A1 | 5/2006 | Sano et al. | |
| 2007/0063211 A1 | 3/2007 | Iwasaki | |
| 2007/0194379 A1 | 8/2007 | Hosono et al. | |
| 2007/0284654 A1 | 12/2007 | Rubino et al. | |
| 2008/0315194 A1 | 12/2008 | Kim et al. | |
| 2008/0315200 A1* | 12/2008 | Kim et al. | 257/57 |
| 2009/0008638 A1 | 1/2009 | Kang et al. | |
| 2009/0294764 A1* | 12/2009 | Kim et al. | 257/43 |
| 2010/0276683 A1* | 11/2010 | Kim et al. | 257/43 |

FOREIGN PATENT DOCUMENTS

| JP | 2007-201366 | 8/2007 |
| KR | 10-2007-0102939 | 10/2007 |
| KR | 10-2007-0102969 | 10/2007 |
| KR | 10-2008-0069607 | 7/2008 |
| KR | 10-2008-0076747 | 8/2008 |

OTHER PUBLICATIONS

International Search Report issued Nov. 16, 2010 for PCT/KR2010/001758.
Written Opinion of the International Searching Authority mailed Nov. 16, 2010 for PCT/KR2010/001758.

* cited by examiner

*Primary Examiner* — Victor A Mandala
(74) *Attorney, Agent, or Firm* — Harness, Dickey & Pierce, P.L.C.

(57) ABSTRACT

Provided are an oxide semiconductor and an oxide thin film transistor including the oxide semiconductor. The oxide semiconductor may be formed of an indium (In)-zinc (Zn) oxide in which hafnium (Hf) is contained, wherein In, Zn, and Hf are contained in predetermined or given composition ratios.

14 Claims, 16 Drawing Sheets

OXIDE SEMICONDUCTOR AND THIN FILM TRANSISTOR INCLUDING THE SAME

CROSS-REFERENCE TO RELATED APPLICATIONS

This application claims priority under U.S.C. §119 to Korean Patent Application Nos. 10-2009-0024575 filed on Mar. 23, 2009 and 10-2010-0014739 filed on Feb. 18, 2010, in the Korean Intellectual Property Office (KIPO), the entire contents of which are incorporated herein by reference.

BACKGROUND

1. Field

Example embodiments relate to an oxide semiconductor that may be used in a channel of an oxide thin film transistor or applied to a switching device or a driving device of a display apparatus, for example, a flat panel display, a liquid crystal display, or an organic light emitting display device.

2. Description of the Related Art

Thin film transistors are applied in various application fields; in detail, thin film transistors are used as switching or driving devices of display devices. Currently, liquid crystal displays (LCD) are widely used as TV panels, and thus, research is being conducted to develop methods of applying organic light emitting displays to TVs. Display devices for TVs are being developed to meet the market's needs. Market requirements are, for example, large-sized TVs or digital information displays (DID), lower prices, and a higher image quality (e.g., moving image representation, high resolution, contrast ratio, and color representation). In order to meet such demands, a thin film transistor (TFT) having a large-sized substrate, for example, glass, and improved performance, and which may be applied as a switching or driving device of a display device, is required.

An example of the driving or switching device of a display device is an amorphous silicon thin film transistor (a-Si TFT). The a-Si TFT is currently widely used and is uniformly formed on a large substrate of 2 m×2 m or greater at lower costs. However, as the size and image quality of the display device are increased, higher performance is also required of the driving or switching device. Thus an a-Si TFT of the related art having a mobility of 0.5 $cm^2/Vs$ may not be sufficient. Accordingly, a high performance TFT having greater mobility than the a-Si TFT and a method of manufacturing the same are required.

A poly-crystal silicon thin film transistor (poly-Si TFT) performing better than the a-Si TFT has a higher mobility of several tens to hundreds $cm^2/Vs$, and thus may be applied to display devices with higher image quality, whereas the higher image quality is not realizable by the a-Si TFT. Also, the poly-Si TFT has less deterioration in terms of the device characteristics. However, in order to manufacture a poly-Si TFT, a more complicated manufacturing process is required than the a-Si TFT, and the manufacturing costs thereof are also increased. Thus, although the poly-Si TFT is appropriate for higher image quality and may be applied to products, e.g., an organic light emitting device (OLED), the poly-Si TFT is not cost competitive. Thus, the application thereof is limited. In addition, the poly-Si TFT has not yet been applied in a manufacturing process using a large-sized substrate of 1 m×1 m or greater due to limited manufacturing equipment or undesirable uniformity. Thus, applying the poly-Si TFT to TV products may be difficult.

Recently, a zinc oxide (ZnO)-based thin film transistor (TFT) has been studied as an oxide semiconductor device. Zinc oxide (ZnO), an In—Zn oxide, and oxides doped with gallium (Ga), magnesium (Mg), aluminum (Al), and/or iron (Fe) may be introduced as ZnO-based materials. A ZnO-based semiconductor device may be manufactured in a lower temperature process, and may be easily manufactured to have a larger surface due to its amorphous nature. Also, a ZnO-based semiconductor film has higher mobility, and thus has improved electrical characteristics like the poly-crystal silicon. Research is currently being conducted to develop use of an oxide-based semiconductor material layer having higher mobility, that is, a ZnO-based material layer, in a channel area of a TFT.

SUMMARY

Example embodiments provide an oxide semiconductor in which hafnium (Hf) is added to an In—Zn oxide.

Example embodiments also provide an oxide thin film transistor (TFT) in which the oxide semiconductor in which hafnium (Hf) is added to an In—Zn oxide is included in a channel area.

Additional aspects will be set forth in part in the description which follows and, in part, will be apparent from the description, or may be learned by practice of example embodiments.

According to example embodiments, an oxide semiconductor may include hafnium (Hf), indium (In), and zinc (Zn), wherein a composition ratio of indium (In) is from about 20 at. % to about 46 at. % of the total content of Hf, In, and Zn. A composition ratio of indium (In) may be from about 20 at. % to about 38 at. % with respect to the total content of Hf, In, and Zn. A composition ratio of indium (In) may be from about 25 at. % to about 38 at. % with respect to the total content of Hf, In, and Zn. A composition ratio of hafnium (Hf) may be from about 2 at. % to about 16 at. % with respect to the total content of Hf, In, and Zn. A composition ratio of hafnium (Hf) may be from about 2 at. % to about 10 at. % with respect to the total content of Hf, In, and Zn. The oxide semiconductor may further include Group I, Group II, Group III, Group IV, or Group V elements, or lanthanides. The oxide semiconductor may be amorphous. The oxide semiconductor may be nano-crystalline.

According to example embodiments, an oxide thin film transistor (TFT) may include a gate; a channel formed in a position corresponding to the gate and including hafnium (Hf), indium (In), and zinc (Zn), wherein a composition ratio of indium (In) is from about 20 at. % to about 46 at. % with respect to the total content of Hf, In, and Zn; a gate insulator between the gate and the channel; and a source and a drain configured to contact respective ends of the channel and the gate insulator.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1A:
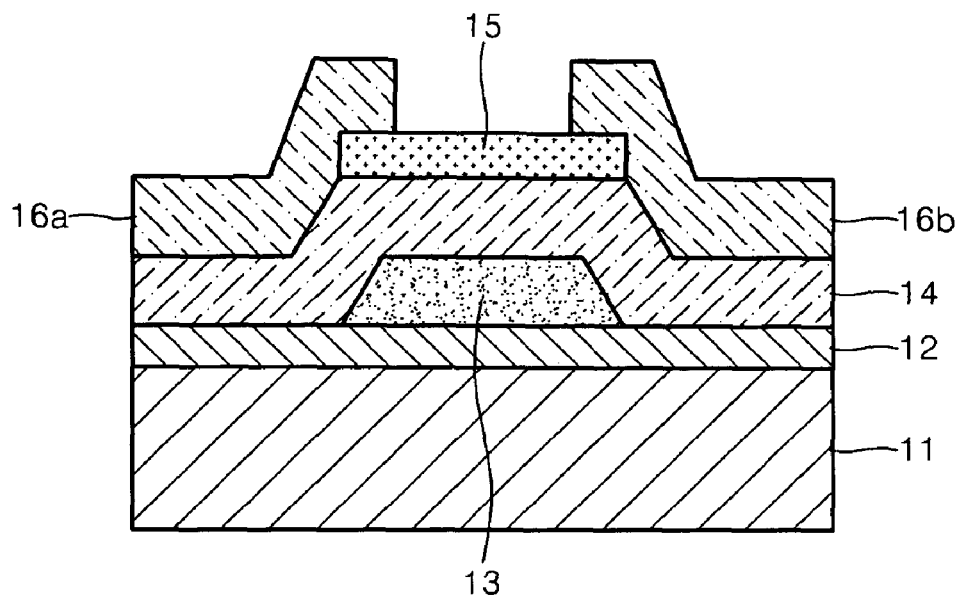
FIGS. 1A and 1B are cross-sectional views each illustrating a thin film transistor (TFT) including an oxide semiconductor, according to example embodiments.

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the description. In the drawings, the thicknesses and widths of layers are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

An oxide semiconductor according to example embodiments is an oxide semiconductor in which hafnium (Hf) is contained in an indium (In)-zinc (Zn) oxide, which is a zinc oxide (ZnO)-based material. In detail, in the oxide semiconductor, hafnium (Hf), indium (In), and zinc (Zn) may exist as respectively being bonded to oxygen (e.g., $HfO_2$, $In_2O_3$, and ZnO), and at least two of hafnium (Hf), indium (In), and zinc (Zn) may be bonded to oxygen. The oxide semiconductor including In—Zn oxide in which hafnium (Hf) is added may be amorphous, mixed-crystalline, or nano-crystalline.

Because hafnium (Hf) has an electronegativity of 1.3, that is, a difference of 2.2 from that of oxygen, which has an electronegativity of 3.5, hafnium (Hf) may form an oxide having a relatively strong ionic bond. Also, an ionic radius of hafnium (Hf) is 0.078 nm, which is similar to an ionic radius of zinc (Zn), which is 0.074 nm. Accordingly, if hafnium (Hf) is contained in an In—Zn oxide, hafnium (Hf) may be easily substituted with zinc (Zn) without deformation in its crystal lattice.

Si:H has a covalent bond, and if this bond is an sp3 bond having a directivity and thus is in an amorphous state, an electron cloud, which is involved in bonding, may be twisted. Accordingly, the bond becomes weak. When a thin film transistor (TFT) having such a bonding structure is driven for a longer time, electrons or holes may be accumulated in the bonding area, the bonding may break, and thus, the reliability of the TFT in regards to variation in a threshold voltage Vth may be deteriorated. On the other hand, in the case of an ionic bond, the size of an electron cloud of anions may be larger, and thus, the electron cloud of the anions may overlap, allowing for a stronger bond regardless if the material is crystalline or amorphous. Accordingly, there is no or only little variation in a threshold voltage. Accordingly, the ionic bond may be regarded as contributing to the manufacture of a TFT having higher reliability. Indium zinc (In—Zn) oxide in which hafnium (Hf) is added may include mostly ionic bonds, and thus, controlling the characteristics of the TFT may be easier. However, not all of the bonds in indium zinc (In—Zn) oxide in which hafnium (Hf) is added need to be ionic bonds.

The Hf—In—Zn oxide semiconductor, which is an In—Zn oxide semiconductor in which hafnium (Hf) is added, may include indium (In) in a ratio from about $20 \leq In \leq 46$ at. % with respect to the total contents of indium (In), zinc (Zn), and hafnium (Hf) in a ratio from about 2 to about 16 at. %. Zinc (Zn) may be included in a ratio of $Zn \geq$ about 30 at. % with respect to the total contents of indium (In), zinc (Zn), and hafnium (Hf). Also, zinc (Zn) may be included in a larger ratio than indium (In), and thus, the ratio of Zn/In may be greater than 1.

In the Hf—In—Zn oxide semiconductor, Group I elements (e.g., Li and K), Group II elements (e.g., Mg, Ca, and Sr), Group III elements (e.g., Ga, Al, In, and Y), Group IV elements (e.g., Ti, Zr, Si, Sn, and Ge), Group V elements (e.g., Ta, Vb, Nb, and Sb), or lanthanides (e.g., La, Ce, Pr, Nd, Pm, Sm, Eu, Gd, Tb, Dy, Ho, Er, Tm, Yb, and Lu) may also be included.

The Hf—In—Zn oxide semiconductor may have the properties of amorphous silicon (a-Si), e.g., a larger size and higher uniformity, and those of poly-crystal silicon (poly-Si), e.g., higher performance and higher reliability. Also, a Hf—In—Zn oxide semiconductor device may be used as a channel material of a driving transistor, a transistor used as a peripheral circuit of a memory device, or a selection transistor.

Figure 1B:
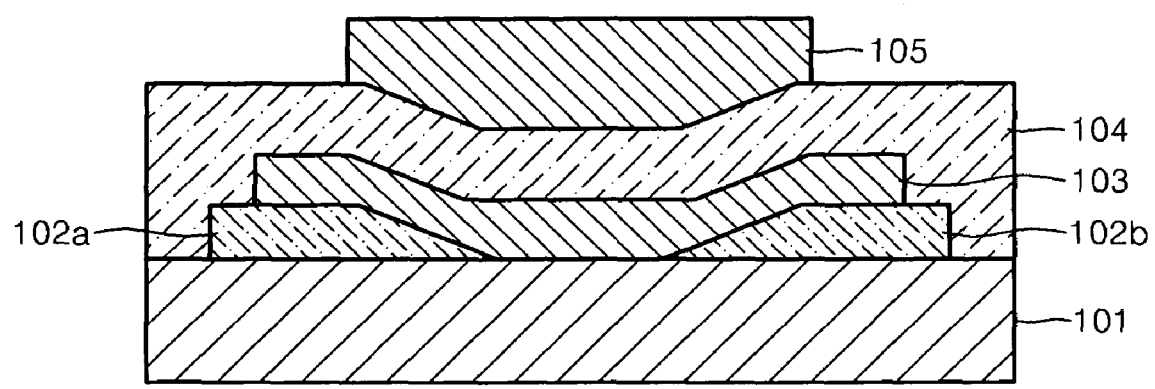

FIGS. 1A and 1B are cross-sectional views each illustrating a TFT including an oxide semiconductor according to example embodiments. In FIG. 1A, a bottom-gate TFT is illustrated, and in FIG. 1B, a top-gate TFT is illustrated.

Referring to FIG. 1A, the bottom-gate TFT may include a substrate 11, a gate electrode 13 formed on an area of the substrate 11, and a gate insulating layer 14 formed on the gate electrode 13 and the substrate 11. If the substrate 11 is formed of silicon, an oxide layer 12 may be formed on a surface of the substrate 11 using a thermal oxidization process, as illustrated in FIG. 1A. A channel 15 formed of a Hf—In—Zn oxide may be formed on a portion of the gate insulating layer 14 in a position corresponding to the gate electrode 13, and a source 16a and a drain 16b may be formed at respective side portions of the channel 15 and the gate insulating layer 14.

Referring to FIG. 1B, the top-gate TFT may include a source 102a and a drain 102b formed on portions of a substrate 101, and a channel 103 formed of a Hf—In—Zn oxide on portions of the source 102a and the drain 102b and a portion of the substrate 101. A gate insulating layer 104 may be formed on the channel 103, the source 102a and the drain 102b, and the substrate 101, and a gate electrode 105 may be formed on a portion of the gate insulating layer 104 in a position corresponding to the channel 103.

Materials of each layer of the bottom and top-gate TFTs illustrated in FIGS. 1A and 1B will be described hereinafter. The substrates 11 and 101 may be substrates that are usually used in semiconductor devices, e.g., silicon, glass, plastic, an organic material or a metal foil. If the substrates 11 and 101 are formed of silicon, a silicon oxide ($SiO_2$) layer may be further formed on surfaces of the substrates 11 and 101 using a thermal oxidization process. The gate electrodes 13 and 105, the sources 16a and 102a, and the drains 16b and 102b may be formed of conductive materials. Examples of the conductive materials may be metals, e.g., titanium (Ti), platinum (Pt), ruthenium (Ru), gold (Au), silver (Ag), molybdenum (Mo), aluminum (Al), tungsten (W), or copper (Cu), or metal or conductive oxides, e.g., IZO(InZnO) or AZO (AlZnO). The gate insulating layers 14 and 104 may be formed using an insulation material that is usually used in semiconductor devices. Examples of the insulation material may include a nitride, e.g., silicon nitride, an oxide, e.g., silicon oxide, hafnium oxide, or aluminum oxide, or mixtures of these, an organic material or a complex material formed of organic and inorganic materials.

Hereinafter, a method of manufacturing an oxide TFT according to example embodiments will be described with reference to FIGS. 2A through 2E. FIGS. 2A through 2E are cross-sectional views illustrating the method of manufacturing an oxide TFT according to example embodiments.

Figure 2A:
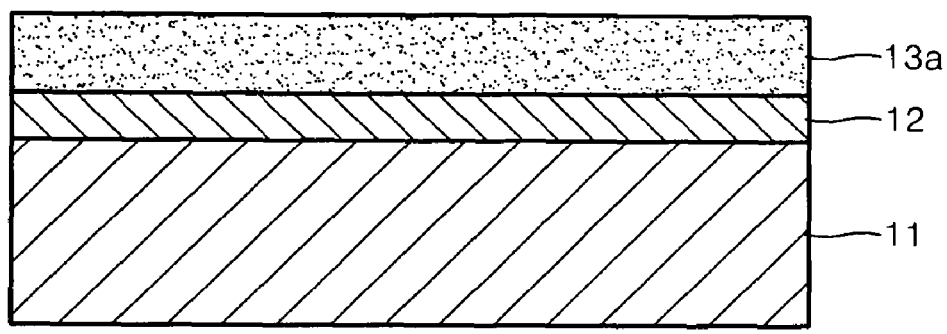
FIGS. 2A through 2E are cross-sectional views illustrating a method of manufacturing an oxide TFT according to example embodiments.

Referring to FIG. 2A, a substrate 11 may be formed. The substrate 11 may be formed of silicon, glass, plastic, an organic material, or a metal foil. If the substrate 11 is formed of silicon, an insulation layer 12 may be selectively formed on a surface of the substrate 11 using a thermal oxidization process. A conductive material 13a, e.g., a metal, or a conductive metal oxide may be coated on, the substrate 11. Examples of the conductive material 13a may include metals, for example, Ti, Pt, Ru, Au, Ag, Mo, Al, W and/or Cu, or metal or conductive oxides, for example, IZO(InZnO) and/or AZO (AlZnO).

Figure 2B:
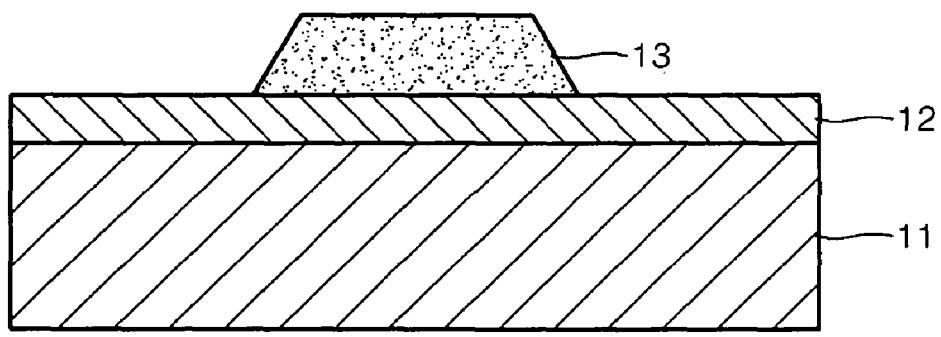
Figure 2C:
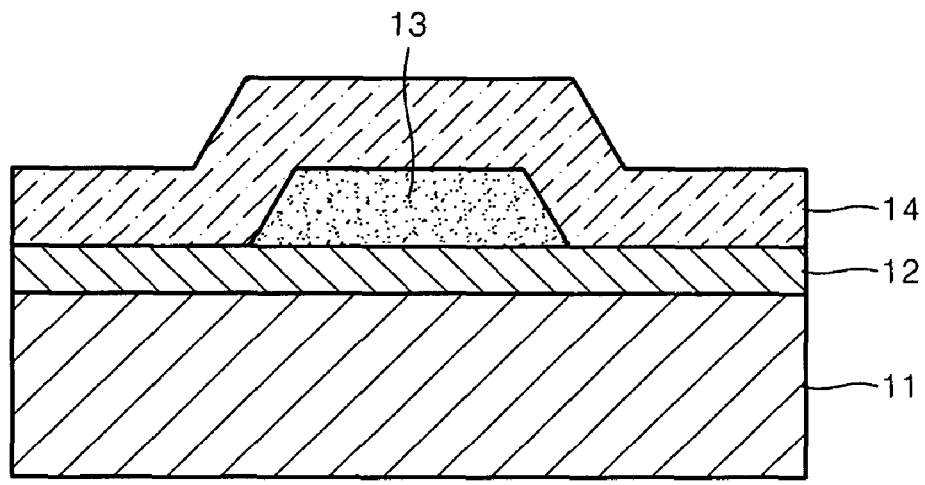

Referring to FIGS. 2B and 2C, the conductive material 13a may be patterned to form a gate electrode 13, and an insulation material may be coated over the substrate 11 and the gate electrode 13 to form a gate insulation layer 14. Examples of the insulation material may be a nitride, e.g., silicon nitride, an oxide, e.g., silicon oxide, hafnium oxide, or aluminum oxide, or mixtures of these, an organic material, or a complex material formed of organic and inorganic materials.

Figure 2D:
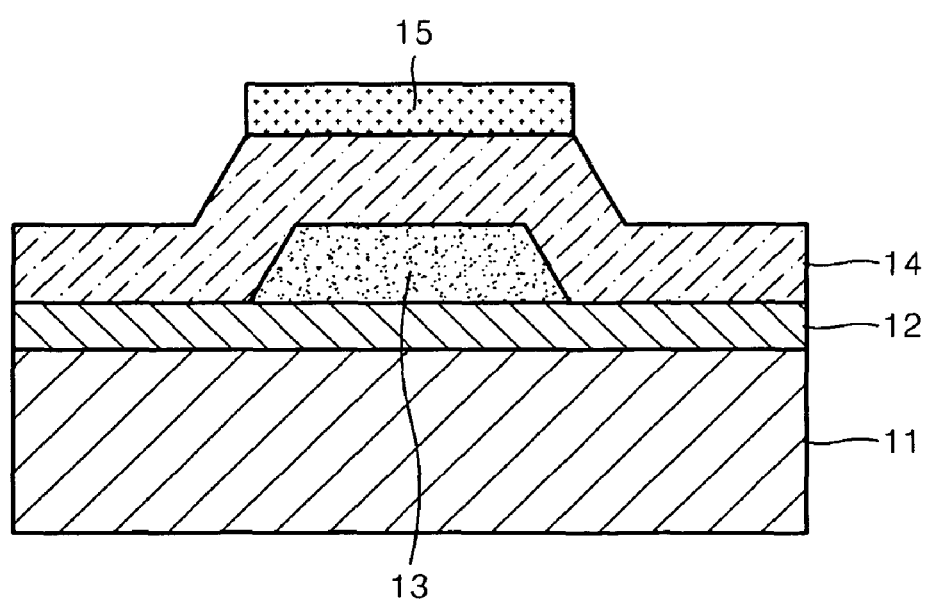

Referring to FIG. 2D, a channel material may be coated on the gate insulation layer 14 using a process, e.g., a physical vapor deposition (PVD) method, a chemical vapor deposition (CVD) method, an atomic layer deposition (ALD) method, or a solution process, and patterned to form a channel 15. The channel 15 may be formed of Hf—In—Zn oxide. For example, when forming the channel 15 using a sputtering process, each of the targets that are respectively formed of an indium (In) oxide, a zinc (Zn) oxide, and a hafnium (Hf) oxide may be mounted individually in a chamber to form the channel 15 using a co-sputtering process. If a composition is set, a single target of a Hf—In—Zn oxide may be used to form the channel 15.

Figure 2E:
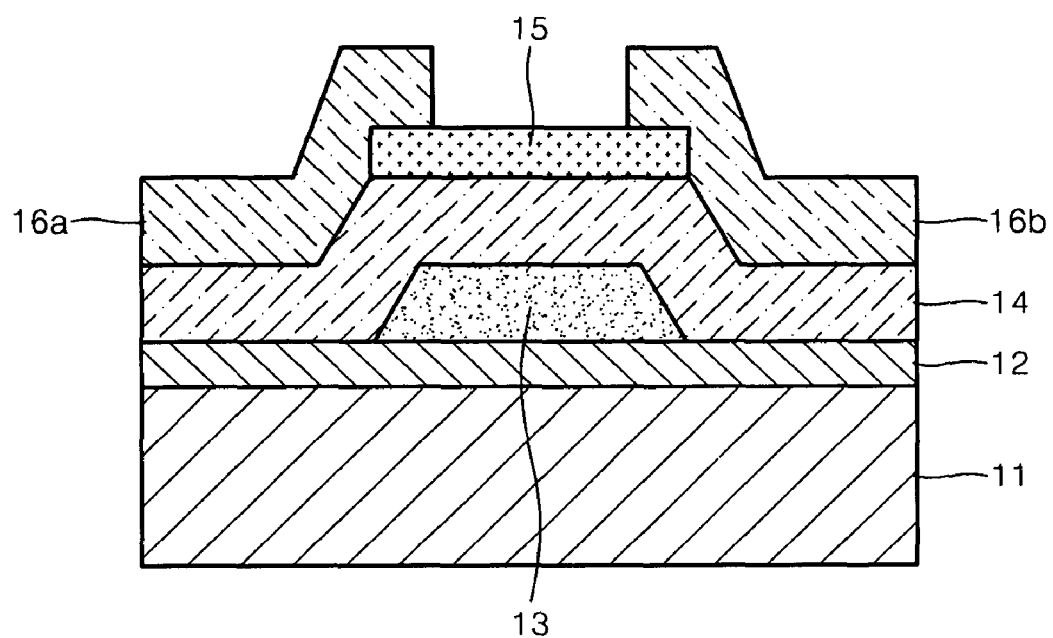

Referring to FIG. 2E, a metal or a conductive metal oxide may be coated on the channel 15 and the gate insulation layer 14 and may be patterned such that part of an upper portion of the channel 15 is exposed, thereby forming a source 16a and a drain 16b.

An oxide TFT may be manufactured in the above-described manner and electrical characteristics thereof were measured. A gate electrode, a source, and a drain of the oxide TFT were formed of molybdenum (Mo), and a gate insulation layer was formed of a silicon nitride. A channel formed of Hf—In—Zn oxide and having a thickness of about 70 nm was formed by mounting each of the targets of hafnium (Hf) oxide, indium (In) oxide, and zinc (Zn) oxide available by LTS, Inc. in a chamber of a sputtering device (SME-200U, available by ULVAC) and by conducting a co-sputtering process. The content of each of the elements of the Hf—In—Zn oxide was measured using an inductively coupled plasma (ICP)—atomic emission spectroscopy (AES) method.

Figure 3A:
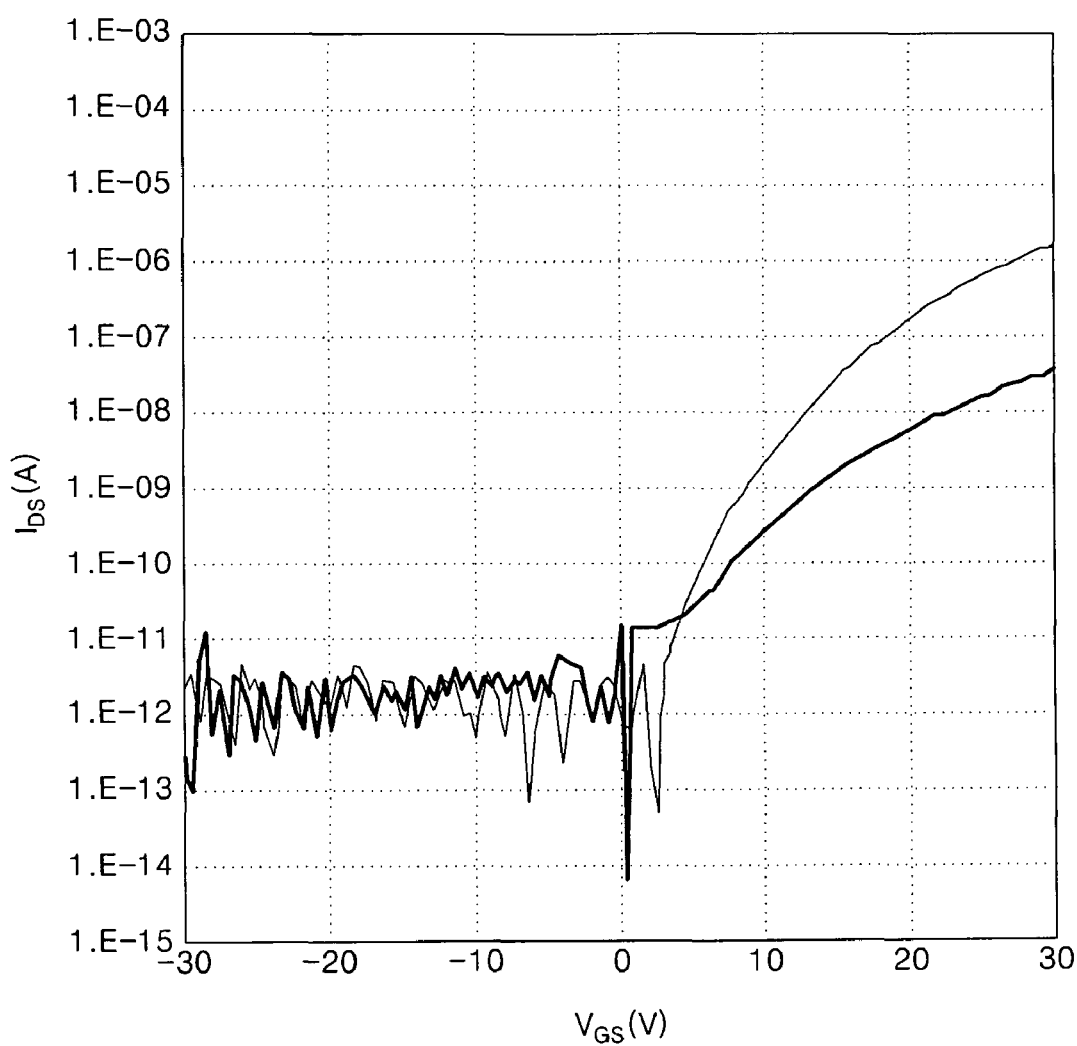
FIGS. 3A and 3B are graphs showing a drain-source current $I_{ds}$ with respect to a gate-source voltage $V_{gs}$ when drain-source voltages $V_{ds}$ of oxide TFTs each formed with a channel which includes a relatively large amount of hafnium (Hf) are 0.1 V and 10 V, respectively.
Figure 3B:
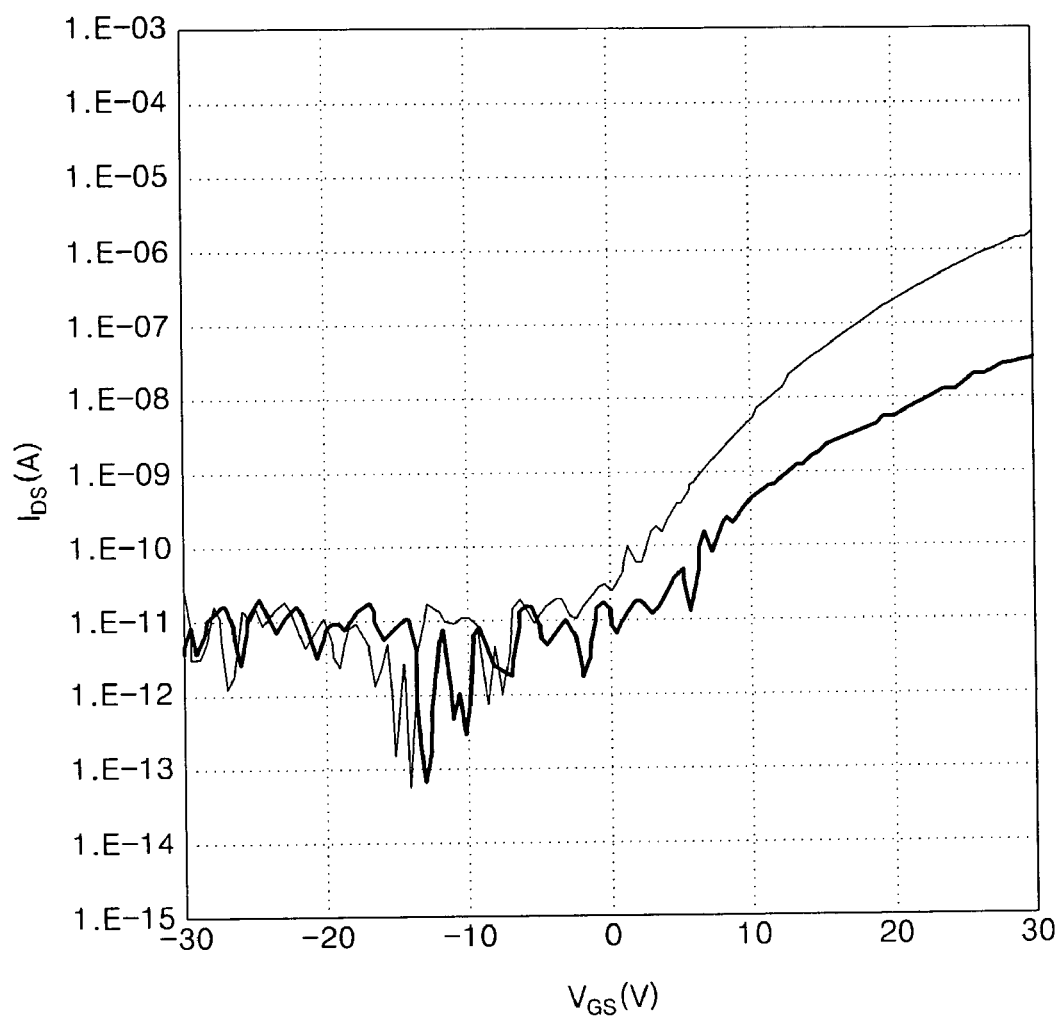

FIGS. 3A and 3B are graphs showing a drain-source current $I_{ds}$ with respect to a gate-source voltage $V_{gs}$ when drain-source voltages $V_{ds}$ of oxide TFTs each formed with a channel which includes a relatively large amount of hafnium (Hf) are 0.1 V and 10V, respectively. A ratio of hafnium (Hf), indium (In), and zinc (Zn) of the oxide TFT of FIG. 3A in at. % is 12:34:54, and a ratio of hafnium (Hf), indium (In), and zinc (Zn) of the oxide TFT of FIG. 3B in at. % is 11:51:38. Referring to FIGS. 3A and 3B, when a hafnium (Hf) content is larger, the amount of carriers may be reduced, and thus the oxide TFT has a channel mobility of about 0.65 $cm^2/V.s$, which is relatively low. In the case of the Hf—In—Zn oxide semiconductor, hafnium (Hf) may be contained in a ratio from about 2 to about 16 at. %, and to obtain higher channel mobility, the content of hafnium (Hf) may be in a ratio from about 2 to about 10 at. %.

Figure 4A:
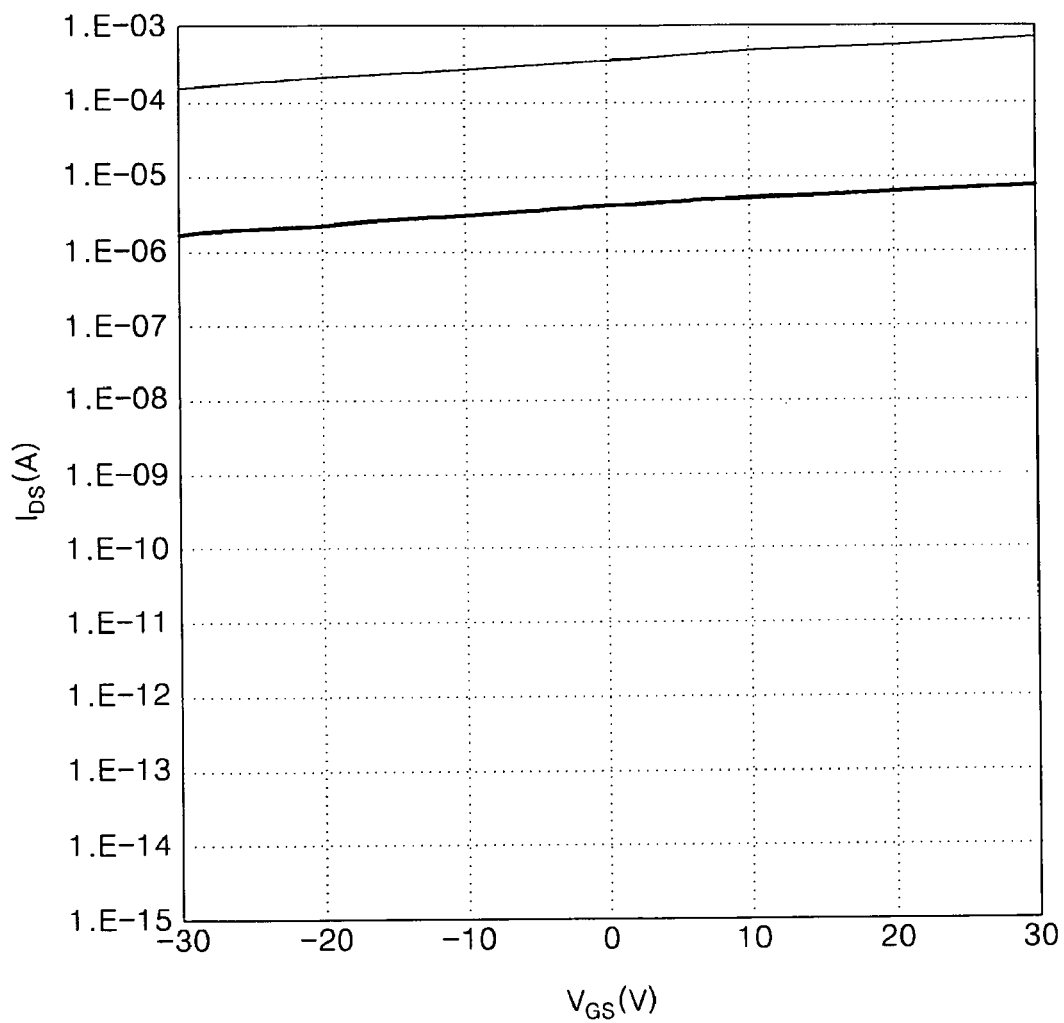
FIGS. 4A and 4B are graphs showing a drain-source current $I_{ds}$ with respect to a gate-source voltage $V_{gs}$ when drain-source voltages $V_{ds}$ of oxide TFTs each formed of a channel which includes a relatively large amount of indium (In) are 0.1 V and 10 V, respectively.
Figure 4B:
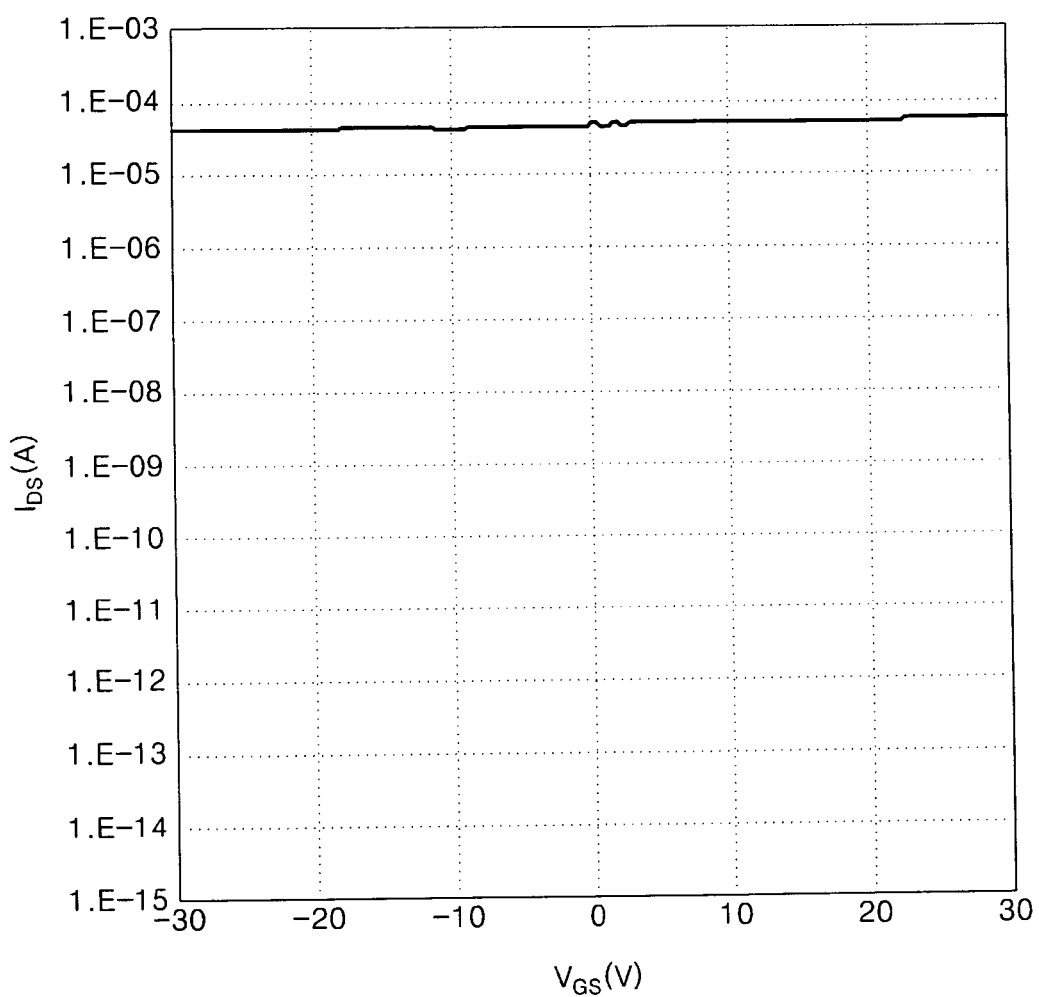

FIGS. 4A and 4B are graphs showing a drain-source current $I_{ds}$ with respect to a gate-source voltage $V_{gs}$ when drain-source voltages $V_{ds}$ of oxide TFTs each formed of a channel which includes a relatively large amount of indium (In) are 0.1 V and 10 V, respectively. A ratio of hafnium (Hf), indium (In), and zinc (Zn) of the oxide TFT of FIG. 4A in at. % is 6:66:28, and a ratio of hafnium (Hf), indium (In), and zinc (Zn) of the oxide TFT of FIG. 4B in at. % is 4:80:16. Referring to FIGS. 4A and 4B, there is hardly a change in the source-drain current $I_{ds}$ according to a gate-source voltage, which indicates that the oxide TFTs do not show switching characteristics. In the case of the Hf—In—Zn oxide semiconductor, indium (In) may be contained in a range from about 0<In≦60 at. %.

FIGS. 5A through 5D are graphs each showing a drain-source current $I_{ds}$ with respect to a gate-source voltage $V_{gs}$ when a drain-source voltage $V_{ds}$ of an oxide TFT formed with a channel which includes a relatively large amount of zinc (Zn) is 10 V, which is measured for a gate voltage bias stress test. Data was measured with respect to a sample every 1800 sec (=30 min) for 3 hours (=10800 sec), after a first measurement of the sample. A bias stress condition was such that −20 V was applied to a gate electrode, and 10 V was applied between source and drain electrodes at the same time, and variation in a threshold voltage Vth was measured every bias stress time, thereby evaluating the reliability of the oxide TFT. In the case of the oxide TFT of FIG. 5A, a ratio of hafnium (Hf), indium (In), and zinc (Zn) in at. % was 5:25:70, in the case of the oxide TFT of FIG. 5B, a ratio of hafnium (Hf), indium (In), and zinc (Zn) in at. % was 2:46:52, in the case of the oxide TFT of FIG. 5C, a ratio of hafnium (Hf), indium (In), and zinc (Zn) in at. % was 6:56:38, and in the case of the oxide TFT of FIG. 5D, a ratio of hafnium (Hf), indium (In), and zinc (Zn) in at. % was 6:20:74.

Figure 5A:
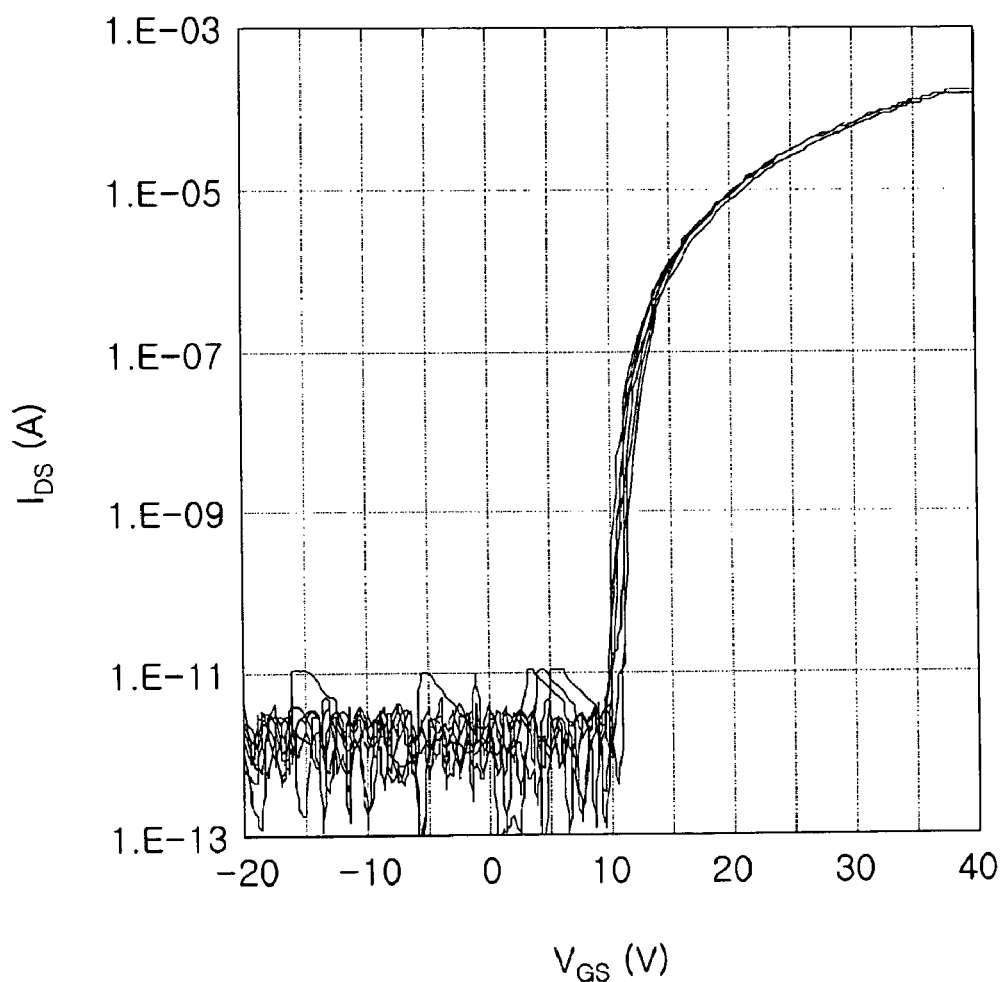
FIGS. 5A through 5D are graphs each showing a drain-source current $I_{ds}$ with respect to a gate-source voltage $V_{gs}$ when a drain-source voltage $V_{ds}$ of an oxide TFT formed with a channel which includes a relatively large amount of zinc (Zn) is 10 V, which is measured for a gate voltage bias stress test.
Figure 5B:
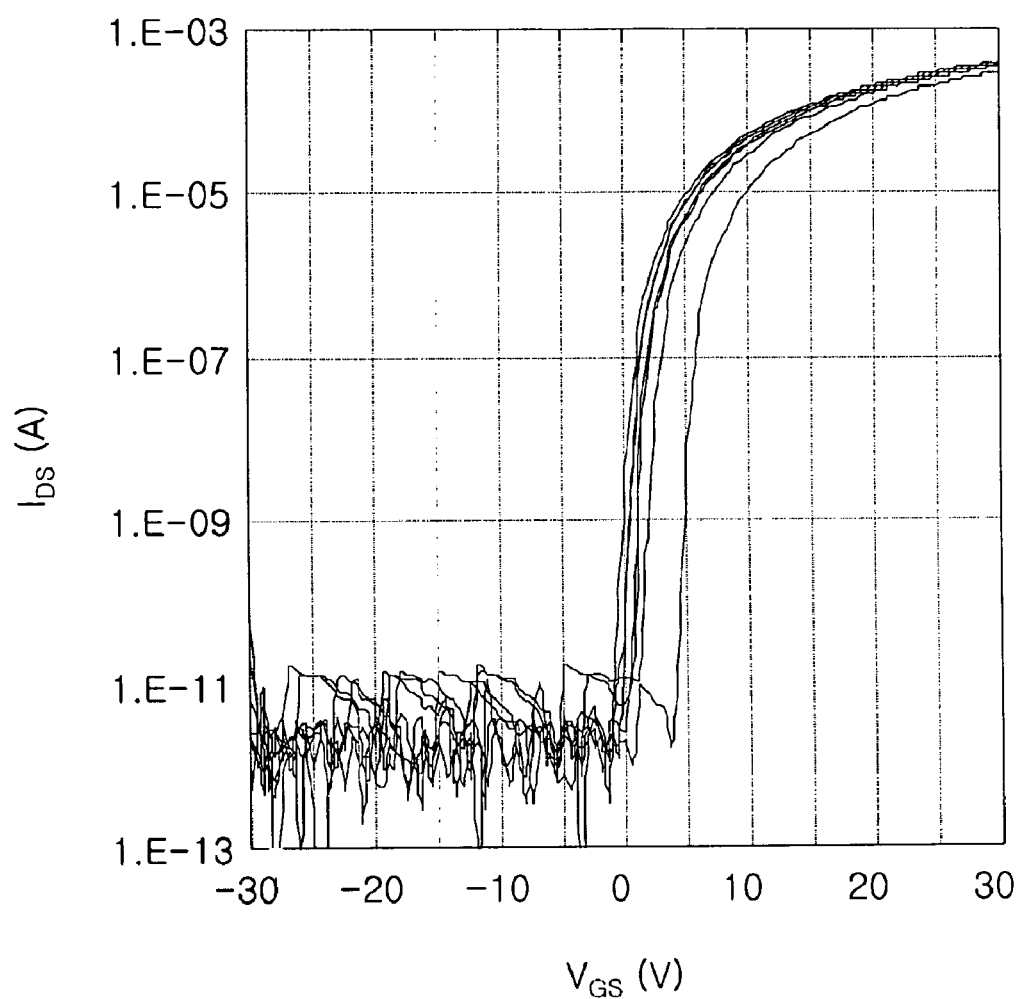
Figure 5C:
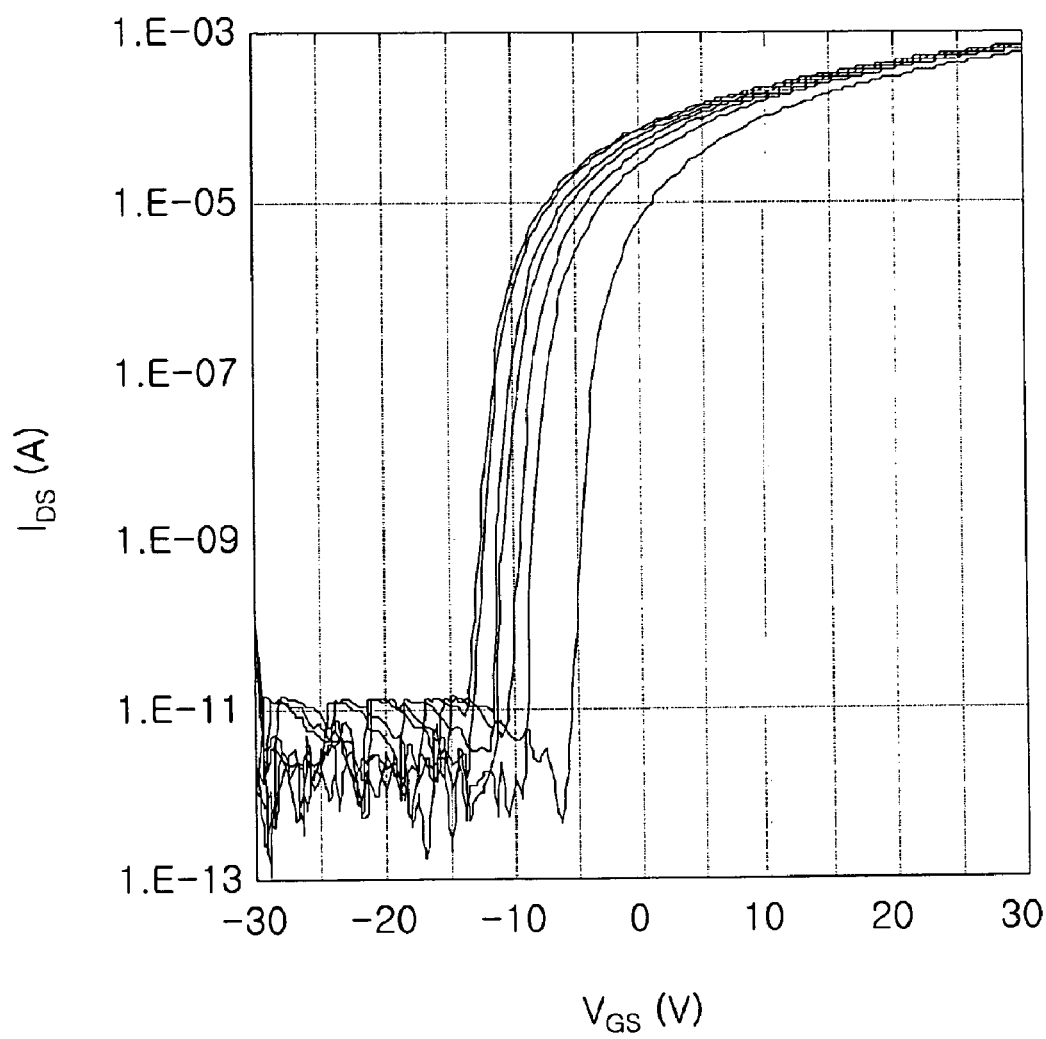
Figure 5D:
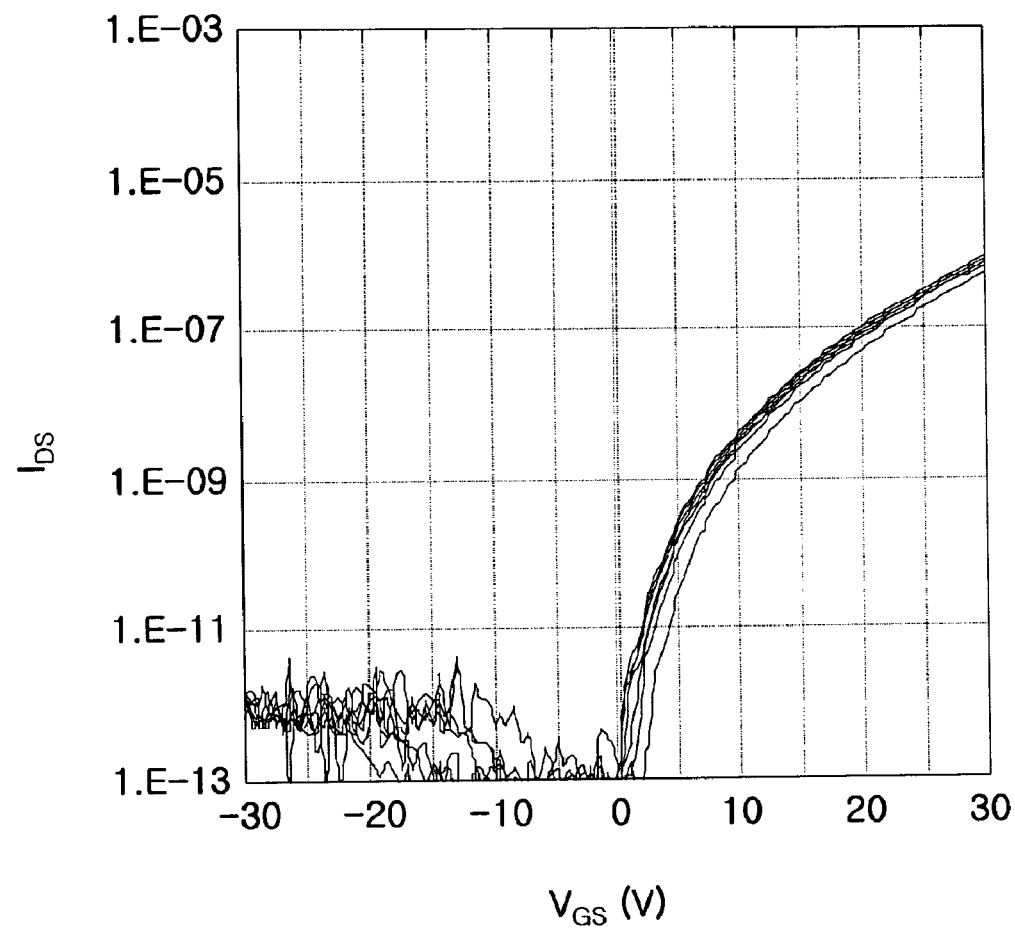

Referring to FIGS. 5A and 5B, the oxide TFTs show switching characteristics of stable transistors. That is, when indium (In) is included in a ratio from about 20—about 46 at. %, the oxide TFT may have stable switching characteristics Referring to FIG. 5C, the oxide TFT shows switching characteristics but there are differences in switching characteristics over time.

Consequently, when the ratio of indium (In) is about 20—about 46 at. %, the ratio of zinc (Zn) is about 30 at. % or greater, and the ratio of hafnium (Hf) is about 2—about 16 at. % in the Hf—In—Zn oxide, an oxide TFT may have stable electrical characteristics.

Figure 6A:
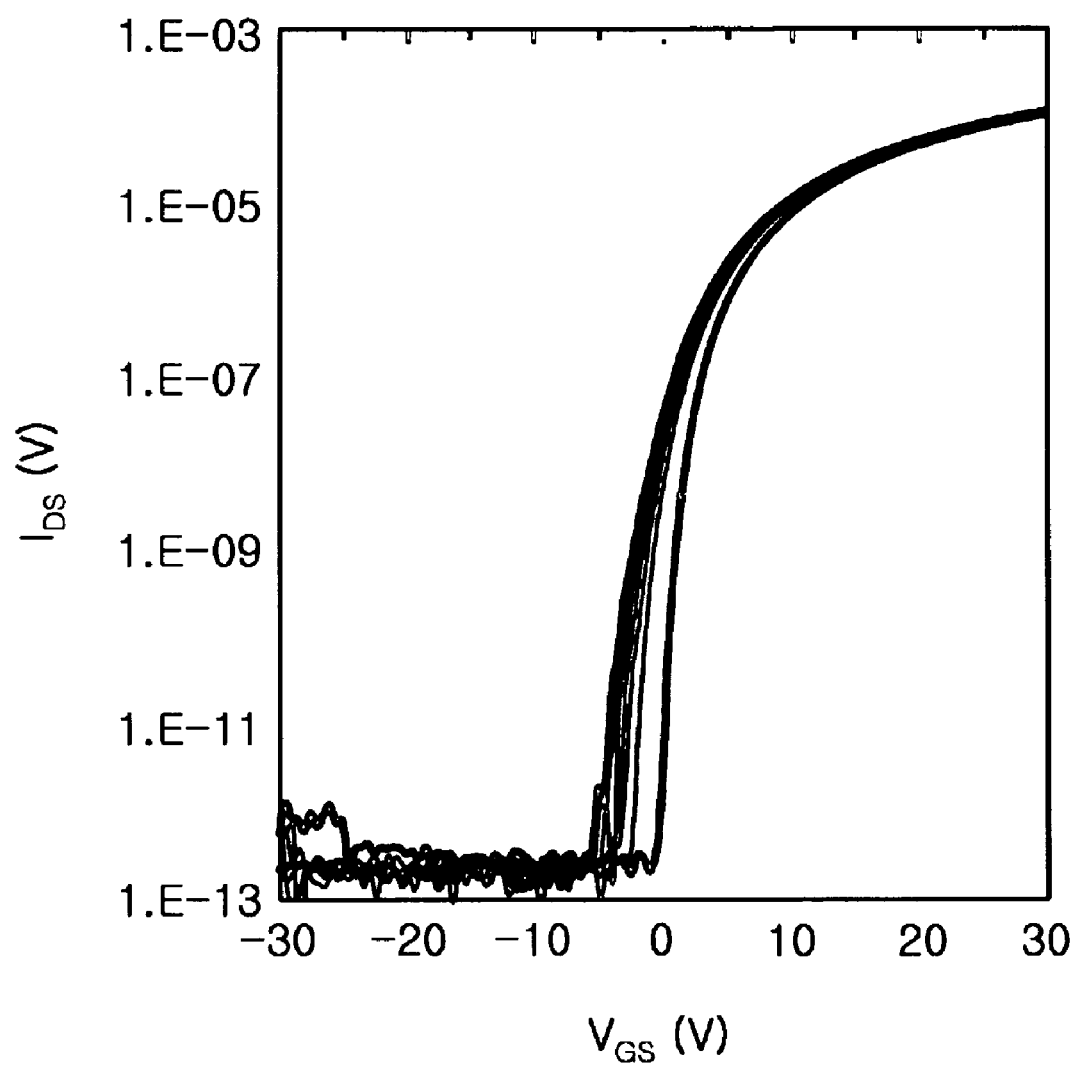
FIGS. 6A through 6C are graphs each showing a drain-source current $I_{ds}$ with respect to a gate-source voltage $V_{gs}$ of an oxide TFT that includes a channel formed of a Hf—In—Zn oxide in different composition ratios under a negative bias illumination thermal stress (NBITS) condition with time.
Figure 6B:
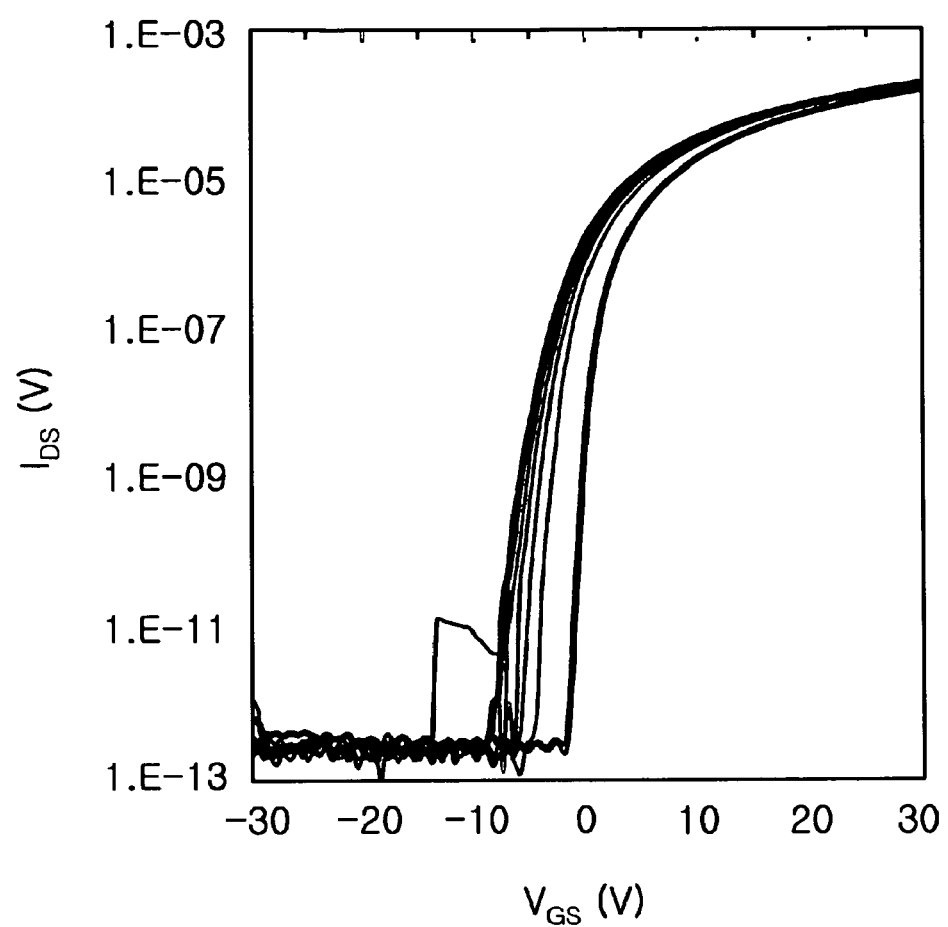
Figure 6C:
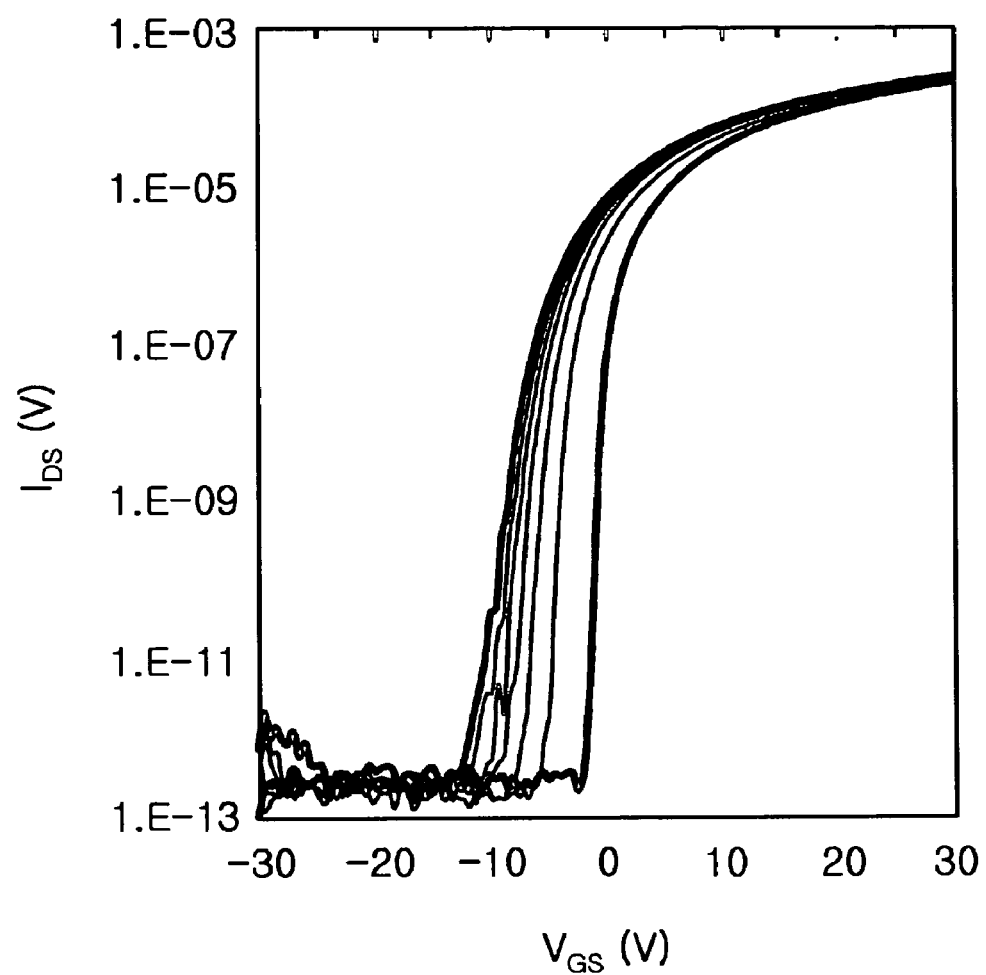

FIGS. 6A through 6C are graphs each showing a drain-source current $I_{ds}$ with respect to a gate-source voltage $V_{gs}$ of an oxide TFT that includes a channel formed of a Hf—In—Zn oxide in different composition ratios under a negative bias illumination thermal stress (NBITS) condition with time. The NBITS condition refers to a gate voltage bias stress test to which thermal and optical stress conditions are further added to speed up deterioration of a device. Particularly, because the oxide TFT is applied to display devices, e.g., an LCD, an optical stress test may be a significant factor in regard to evaluating reliability of the oxide TFT.

A gate-source voltage $V_{GS}$ of −20 V and a drain-source voltage $V_{DS}$ of 10V were applied to samples while applying light of about 140 lumen/m$^2$ to the samples at a temperature of about 60° C. and under a N$_2$ atmosphere of 1 atm. In the case of the oxide semiconductor of FIG. 6A, a ratio of hafnium (Hf), indium (In), and zinc (Zn) in at. % was 10:56:34, and in the case of the oxide semiconductor of FIG. 6B, a ratio of hafnium (Hf), indium (In), and zinc (Zn) in at. % was 10:45:54, and in the case of the oxide semiconductor of FIG. 6C, a ratio of hafnium (Hf), indium (In), and zinc (Zn) in at. % was 10:38:52. Data was measured from each of the samples initially when no stress was applied. Then data was measured every 30 minutes for 3 hours, and results of the measurement are shown in FIG. 6D.

Referring to FIGS. 6A through 6C, a transfer curve is moved to the left with time as stress is applied. In detail, a variation in a threshold voltage $V_{th}$ of the device is greatest in FIG. 6A over stress-applying time, and a variation in the threshold voltage $V_{th}$ of the device is smallest in FIG. 6C over stress-applying time, as shown in FIG. 6D.

Figure 6D:
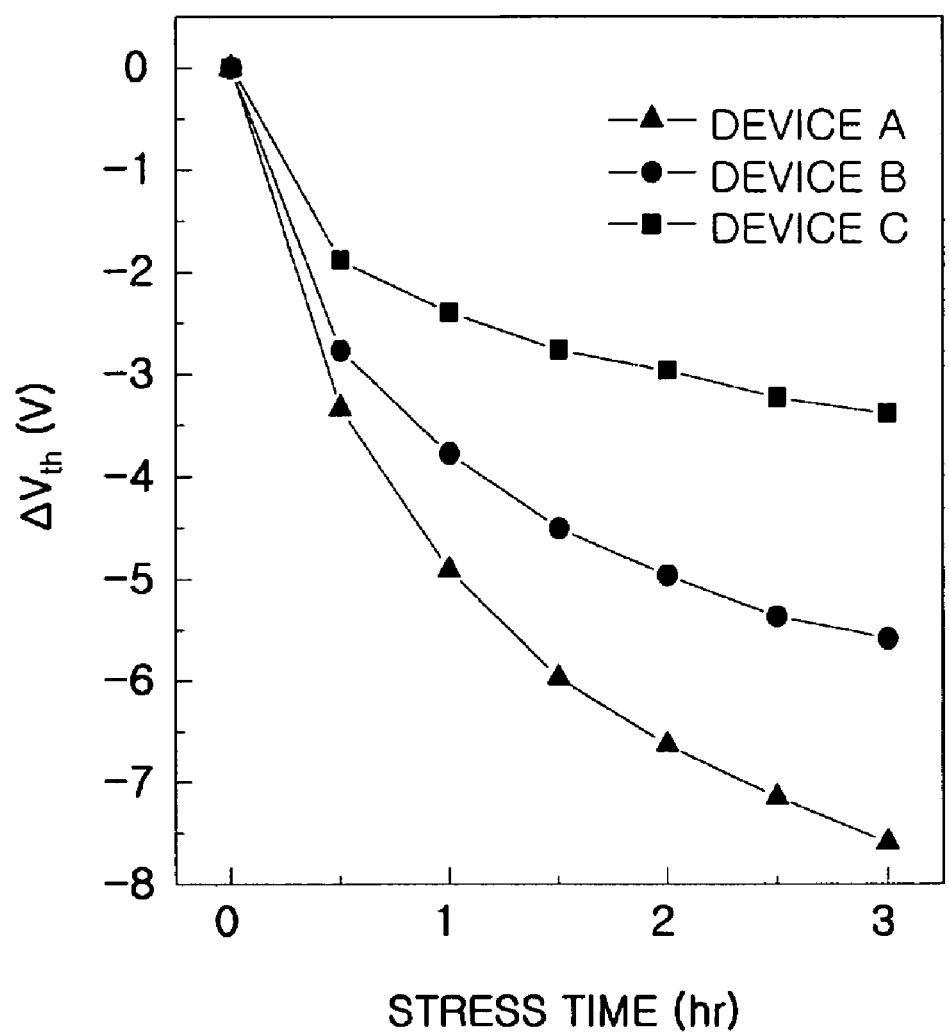
FIG. 6D is a graph showing variations in threshold voltages of samples according to the measurement results of FIGS. 6A through 6C.

FIG. 6D is a graph showing variations in threshold voltages of the samples according to the measurement results of FIGS. 6A through 6C. Here, a horizontal axis denotes a stress-applying time, and a vertical axis denotes a variation in a threshold voltage. Device A denotes the sample of FIG. 6A, Device B denotes the sample of FIG. 6B, and Device C denotes the sample of FIG. 6C. Referring to FIG. 6D, when stress is applied for 3 hours, amplitude of the threshold voltage is moved in a (−) direction; here, a variation in a threshold voltage of Device C is about −3.5 V, which is the smallest, and a variation in a threshold voltage of Device A is about −7.8 V, which is the greatest.

Referring to FIGS. 6A through 6D, in the case of the Hf—In—Zn oxide TFT, variation in the threshold voltage is greater under a stress condition when a composition ratio of In in at. % among hafnium (Hf), indium (In), and zinc (Zn) increases. Accordingly, as described above, when the composition ratio of In in at. % among Hf, indium (In), and zinc (Zn) of the hafnium (Hf)-indium (In)-zinc (Zn) oxide TFT is larger, forming an oxide TFT having improved characteristics due to the large variation in the threshold voltage is difficult.

Referring to the results of FIGS. 5A through 5D and the results of FIGS. 6A through 6D, the switching characteristics of the oxide TFT may be stabilized when the composition ratio of indium (In) is 20-38 at. % with respect to the total content of indium (In), zinc (Zn), and hafnium (Hf). Also, the composition ratio of indium (In) may be in a range of 25-38 at. %.

According to example embodiments, a Hf—In—Zn oxide semiconductor with the above-described composition ratios has the properties of a-Si, e.g., a larger size and higher uniformity and those of poly-Si, e.g., higher performance and higher reliability. Also, the Hf—In—Zn oxide semiconductor may be used as a channel material of a driving transistor, a transistor used as a peripheral circuit of a memory device, or a selection transistor.

It should be understood that example embodiments described therein should be considered in a descriptive sense only and not for purposes of limitation. An oxide TFT according to example embodiments may be a bottom-gate TFT or a top-gate TFT. Descriptions of features or aspects within each embodiment should typically be considered as available for other similar features or aspects in other example embodiments.

What is claimed is:

1. An oxide semiconductor comprising hafnium (HI), indium (In), and zinc (Zn), wherein a composition ratio of indium (In) is from about 25 at. % to about 46 at. % of the total content of Hf, In, and Zn.

2. The oxide semiconductor of claim 1, wherein a composition ratio of indium (In) is from about 25 at. % to about 38 at. % with respect to the total content of In, Zn, and Hf.

3. The oxide semiconductor of claim 1, wherein a composition ratio of hafnium (Hf) is from about 2 at. % to about 16 at. % with respect to the total content of Hf, In, and Zn.

4. The oxide semiconductor of claim 3, wherein a composition ratio of hafnium (Hf) is from about 2 at. % to about 10 at. % with respect to the total content of Hf, In, and Zn.

5. The oxide semiconductor of claim 1, wherein the oxide semiconductor further comprises Group I, Group II, Group III, Group IV, or Group V elements, or lanthanides.

6. The oxide semiconductor of claim 1, wherein the oxide semiconductor is amorphous.

7. The oxide semiconductor of claim 1, wherein the oxide semiconductor is nano-crystalline.

8. An oxide thin film transistor (TFT) comprising: a gate; a channel formed in a position corresponding to the gate and comprises hafnium (Hf), indium (In), and zinc (Zn), wherein a composition ratio of In is from about 25 at. % to about 46 at. % with respect to the total content of Hf, In, and Zn; a gate insulator between the gate and the channel; and a source and a drain configured to contact respective ends of the channel and the gate insulator.

9. The oxide TFT of claim 1, wherein a composition ratio of In is from about 25 at. % to about 38 at. % with respect to the total content of In, Zn, and HF.

10. The oxide TFT of claim 8, wherein a composition ratio of hafnium (Hf) is from about 2 at. % to about 16 at. % with respect to the total content of Hf, In, and Zn.

11. The oxide TFT of claim 10, wherein a composition ratio of hafnium (Hf) is from about 2 at. % to about 10 at. % with respect to the total content of Hf, In, and Zn.

12. The oxide TFT of claim 8, wherein the oxide semiconductor further comprises Group I, Group II, Group III, Group IV, or Group V elements, or lanthanides.

13. The oxide TFT of claim 8, wherein the oxide semiconductor is amorphous.

14. The oxide TFT of claim 8, wherein the oxide semiconductor is nano-crystalline.

* * * * *